(12) United States Patent
Schueller

(10) Patent No.: US 6,507,118 B1
(45) Date of Patent: Jan. 14, 2003

(54) MULTI-METAL LAYER CIRCUIT

(75) Inventor: Randolph D. Schueller, Austin, TX (US)

(73) Assignee: 3M Innovative Properties Company, St. Paul, MN (US)

( * ) Notice: Subject to any disclaimer, the term of this patent is extended or adjusted under 35 U.S.C. 154(b) by 77 days.

(21) Appl. No.: 09/617,530

(22) Filed: Jul. 14, 2000

(51) Int. Cl.[7] ............................................... H01L 23/48
(52) U.S. Cl. ........................ 257/778; 257/737; 257/750; 29/852
(58) Field of Search ........................... 29/852; 257/737; 361/760; 174/260

(56) References Cited

U.S. PATENT DOCUMENTS

| | | | |
|---|---|---|---|
| 3,868,724 A | 2/1975 | Perrino | 357/65 |
| 4,710,798 A | 12/1987 | Marcantonio | 357/80 |
| 5,019,673 A | 5/1991 | Juskey et al. | 174/52.2 |
| 5,159,535 A | 10/1992 | Desai et al. | 361/398 |
| 5,346,861 A | 9/1994 | Khandros et al. | 437/209 |
| 5,352,926 A | 10/1994 | Andrews | 257/717 |

(List continued on next page.)

FOREIGN PATENT DOCUMENTS

| | | |
|---|---|---|
| EP | 0 923 128 A1 | 6/1999 |
| WO | WO 00/13232 | 3/2000 |
| WO | WO 00/22674 | 4/2000 |

OTHER PUBLICATIONS

Schueller, "New Chip Scale Package with CTE Matching to the Board", IEEE/CPMT Int'l Electronics Manufacturing Technology Symposium, Oct. 13, 1997, pp. 205–215.

Clatanoff et al., "µBGA Chip Scale Electronic Package with Flexible Microcircuitry", IEMT/IMC Proceedings, Apr. 16, 1997, pp. 401–406.

International Search Report for PCT/US 00/31982.

Primary Examiner—Hoai Ho
Assistant Examiner—Mai-Huong Tran
(74) Attorney, Agent, or Firm—Darla P. Fonseca

(57) ABSTRACT

A printed circuit assembly includes an interposer circuit having a flexible dielectric core with an array of contact members attached thereto. Each contact member includes a first interconnect surface accessible from a first side of the dielectric core and a second interconnect surface accessible from a second side of the dielectric core. A conductive element is attached to the first interconnect surface of each contact member. A flip chip semiconductor die includes an array of bond pads on a mounting surface thereof. Each bonding pad of the semiconductor die is substantially aligned with a respective one of the first interconnect surfaces of the interposer circuit. Each bonding pad is electrically connected to the corresponding conductive element. The electronic device defines a perimeter edge that circumscribes the array of bonding pads and the array of contact members of the interposer circuit. A solder ball is attached to the second interconnect surface of each contact member. A printed circuit substrate includes an array of solder ball pads on a surface thereof. Each one of the solder ball pads is substantially aligned with a respective one of the second interconnect surfaces. Each one of the solder ball pads is electrically connected to the corresponding solder ball.

6 Claims, 6 Drawing Sheets

U.S. PATENT DOCUMENTS

| | | | | |
|---|---|---|---|---|
| 5,384,955 | A | 1/1995 | Booth et al. | 29/830 |
| 5,491,303 | A | 2/1996 | Weiss | 174/262 |
| 5,504,035 | A | 4/1996 | Rostoker et al. | 437/182 |
| 5,585,162 | A | 12/1996 | Schueller | 428/131 |
| 5,602,419 | A | 2/1997 | Takeda et al. | 257/673 |
| 5,615,477 | A | 4/1997 | Sweitzer | 29/840 |
| 5,616,958 | A | 4/1997 | Laine et al. | 257/717 |
| 5,636,996 | A | 6/1997 | Johnson et al. | 439/66 |
| 5,637,920 | A | 6/1997 | Loo | 257/700 |
| 5,674,785 | A | 10/1997 | Akram et al. | 437/217 |
| 5,686,764 | A | 11/1997 | Fulcher | 527/778 |
| 5,699,613 | A * | 12/1997 | Chong et al. | 29/852 |
| 5,708,296 | A | 1/1998 | Bhansali | 257/698 |
| 5,714,800 | A | 2/1998 | Thompson | 257/690 |
| 5,719,749 | A | 2/1998 | Stopperan | 361/769 |
| 5,729,894 | A | 3/1998 | Rostoker et al. | 29/832 |
| 5,777,386 | A | 7/1998 | Higashi et al. | 257/737 |
| 5,790,378 | A | 8/1998 | Chillara | 361/719 |
| 5,798,567 | A | 8/1998 | Kelly et al. | 257/723 |
| 5,866,949 | A | 2/1999 | Schueller | 257/778 |
| 5,909,010 | A | 6/1999 | Inoue | 174/260 |
| 5,925,930 | A * | 7/1999 | Farnworth et al. | 257/737 |
| 5,962,925 | A | 10/1999 | Eifuku et al. | 257/778 |
| 6,075,710 | A * | 6/2000 | Lau | 361/760 |
| 6,098,282 | A * | 8/2000 | Frankeny et al. | 29/852 |
| 6,192,581 | B1 * | 2/2001 | Tsukamoto | 29/852 |
| 6,281,448 | B1 * | 8/2001 | Tsukamoto | 174/260 |

* cited by examiner

MULTI-METAL LAYER CIRCUIT

BACKGROUND

The disclosures herein relate generally to electronic packages and more specifically, to ball grid array flip chip electronic packages with chip scale interposers.

Flip chip electronic packages continue to gain popularity in the integrated circuit packaging industry. Flip chip electronic packages offer smaller form factors than other types of packages, lower cost in high routing density applications, and excellent electrical performance. Furthermore, an electronic package can be tested in a suitable test apparatus far more easily than a fragile bare die can be tested. Attributes such as these are driving the increase in popularity of flip chip electronic packages.

Presently, flip chip electronic packages are geared toward high performance applications. Flip chip electronic packages for these types of applications typically use multilayer substrates that provide numerous routing layers and reference voltage layers. These types of packages are effective, but are too costly to be used for mainstream applications.

In general, attaching a flip chip electronic package, rather than a bare flip chip die, to a printed circuit board is preferred. A key reason for such a preference is that when a bare die is attached directly to the printed circuit board in a flip chip format, there is a large thermal expansion differential between the die and printed circuit board. The thermal expansion differential contributes to poor thermal cycle fatigue reliability.

To limit the adverse affects of the thermal expansion differential, an underfill material is applied between the die and the printed circuit board. The underfill material helps to distribute stress more evenly, thus reducing the stress on associated solder balls. However, once the underfill is applied, the die cannot be cost-effectively removed from the printed circuit board. Thus, if the die, printed circuit board, or an interconnection therebetween proves to be defective, the entire printed circuit board assembly is typically discarded. As the die and any other components already attached to the printed circuit board are typically expensive, it is undesirable to discard printed circuit board assemblies.

Another limitation of conventional flip chip packages are that they are easily implemented into the existing supply chain industry of the electronics industry. The direct attachment of unpackaged flip chip dies to printed circuit boards do not fit board assemblers capabilities. In particular, the assembly of unpackaged flip chip dies requires an underfill step. This underfill step is timely to complete and requires that an entire printed circuit assembly be discarded if the underfilled die is defective.

Flip chip electronic packages include a flip chip die attached to an interposer circuit. A flip chip electronic package can be cost effectively attached to and removed from a printed circuit board. In such a configuration, the flip chip electronic package can be readily removed from the printed circuit board, if needed. This allows for reworking of the printed circuit board assembly such that the entire printed circuit board assembly does not need to be discarded if a defect in the flip chip electronic package or its interconnection to the printed circuit board is detected.

U.S. Pat. Nos. 5,798,567, 5,777,386, 5,686,764 and 5,616,958 disclose various embodiments of large scale flip chip electronic packages. Each one of the disclosed embodiments includes a flip chip die mounted on a substrate such as an interposer circuit. By large scale, it is meant that the interposer circuit has an area substantially greater than a mounting surface area of the flip chip die. These types of electronic packages provide for signal and power routing in high density applications and provide superior electrical performance relative to other types of electronic packages, such as wire bond electronic packages. However, the benefits associated with the small form factor of chip scale packages is not captured by large scale flip chip electronic packages.

U.S. Pat. No. 5,637,920 discloses an embodiment of a flip chip electronic package including a flip chip die mounted on an interposer circuit having a multilayer core. Interposer circuits having multilayer cores provide for increased routing density in a relatively small form factor by routing traces on a plurality of conductive layers. However, interposer circuits having multilayer cores are generally more expensive to fabricate relative to interposer circuits having a single layer dielectric core.

U.S. Pat. Nos. 5,909,010 and 5,866,949 disclose various embodiments of wire bond flip chip electronic packages having a chip scale package (CSP) format. In wire bond CSP flip chip electronic packages, such as those disclosed in the reference patents, the packages include a flip chip die mounted on an interposer circuit. The interposer circuit has a larger area than the flip chip electronic device to enable conductive lead connections to be formed around the respective perimeter edges of the interposer circuit and die. Relative to BGA flip chip electronic packages, the orientation of the conductive leads results in a larger form factor and a reduced level of electrical performance.

Various embodiments of interposer circuits with dielectric cores are known. U.S. Pat. No. 5,346,861 discloses an interposer circuit suitable for lead bonded flip chip electronic packages. A key limitation of lead bonded flip chip electronic packages is that considerable time is required to bond all of the leads. U.S. Pat. Nos. 5,491,303 and 5,352,926 disclose respective interposer circuits having vias including respective bonding pads on opposing surfaces of a dielectric core. The formation of electrically conductive vias is expensive relative to non-conductive passages extending through a dielectric core. Furthermore, in high density applications such as flip chip CSP's, a solder mask layer must be formed on the opposing surfaces of the dielectric core to contain solder during reflow.

Therefore, for flip chip electronic packages to be seen as an acceptable packaging configuration for mainstream applications, what is needed is a flip chip electronic package that can be cost effectively assembled and tested by a package assembly subcontractor and that can be cost effectively attached to a printed circuit assembly by a board assembly contractor.

SUMMARY

Embodiments of electronic packages according to the present invention will provide an effective balance between cost, electrical performance, routing density and form factor. Furthermore, such embodiments will also provide for cost effective integration into existing assembly and testing operations used for conventional types of packaging solutions.

An embodiment of a chip scale electronic package, accordingly, includes an interposer circuit having a dielectric core with an array of contact members attached to the dielectric core. Each contact member includes a first interconnect surface accessible from a first side of the dielectric core and a second interconnect surface accessible from a second side of the dielectric core. A flip chip electronic device including an array of bond pads on a mounting surface of the electronic device A conductive element is attached to the first interconnect surface of each contact member. Each bonding pad is substantially aligned with a respective one of the first interconnect surfaces of the interposer circuit. Each bonding pad is electrically connected to the corresponding conductive element.

The dielectric core preferably includes a layer of flexible polymeric material. The dielectric core of the present invention is preferably a single layer of polymeric material. In some embodiments of the present invention, a multilayer dielectric core including a plurality of layers of dielectric material or materials may be desirable. Examples of suitable flexible polymeric materials include polyimide and polyester.

One embodiment of contact members includes solder pads mounted on a surface of the dielectric core adjacent to a respective passage extending through the dielectric core. A first interconnect surface of each contact member is exposed in the respective passage.

Another embodiment of contact members includes conductive plugs extending through passages in the dielectric core. A first end of each conductive plug defines a first interconnect surface thereof and a second end of each conductive plug defines a second interconnect surface thereof.

An embodiment of a printed circuit assembly includes an interposer circuit including a flexible dielectric core having an array of contact members attached thereto. Each contact member includes a first interconnect surface accessible from a first side of the dielectric core and a second interconnect surface accessible from a second side of the dielectric core. A conductive element is attached to the first interconnect surface of each contact member. A flip chip semiconductor die including an array of bond pads on a mounting surface thereof has each bonding pad of the semiconductor die substantially aligned with a respective one of the first interconnect surfaces of the interposer circuit. Each bonding pad is electrically connected to the corresponding conductive element. The electronic device defines a perimeter edge that circumscribes the array of bonding pads and the array of contact members of the interposer circuit. A solder ball is attached to the second interconnect surface of each contact member. A printed circuit substrate includes an array of solder ball pads on a surface thereof with each one of the solder ball pads substantially aligned with a respective one of the second interconnect surfaces. Each one of the solder ball pads is electrically connected to the corresponding solder ball.

An embodiment of a method of assembling a flip chip electronic package includes providing an interposer circuit having an array of contact members on a dielectric core and providing an electronic device including an array of conductive elements on a mounting surface thereof. Each contact member of the interposer circuit includes a first interconnect surface accessible from a first side of the dielectric core and a second interconnect surface accessible from a second side of the dielectric core. Each conductive element of the electronic device is aligned with the first interconnect surface of a respective one of the contact members and is subsequently electrically connected thereto.

An embodiment of a method of simultaneously assembling a plurality of flip chip electronic packages includes providing an interposer circuit substrate including an array of contact members attached to a dielectric core and providing a plurality of electronic devices each including an array of bond pads on a respective mounting surface thereof. Each contact member of the interposer circuit substrate includes a first interconnect surface accessible from a first side of the dielectric core and a second interconnect surface accessible from a second side of the dielectric core. A conductive element is formed on each bonding pad of each electronic device. The conductive elements of each electronic device are aligned with the first interconnect surface of a respective one of the contact members. Each conductive element is subsequently electrically connected to the corresponding first interconnect surface.

BRIEF DESCRIPTION OF THE DRAWINGS FIGURES

DETAILED DESCRIPTION

Figure 1:
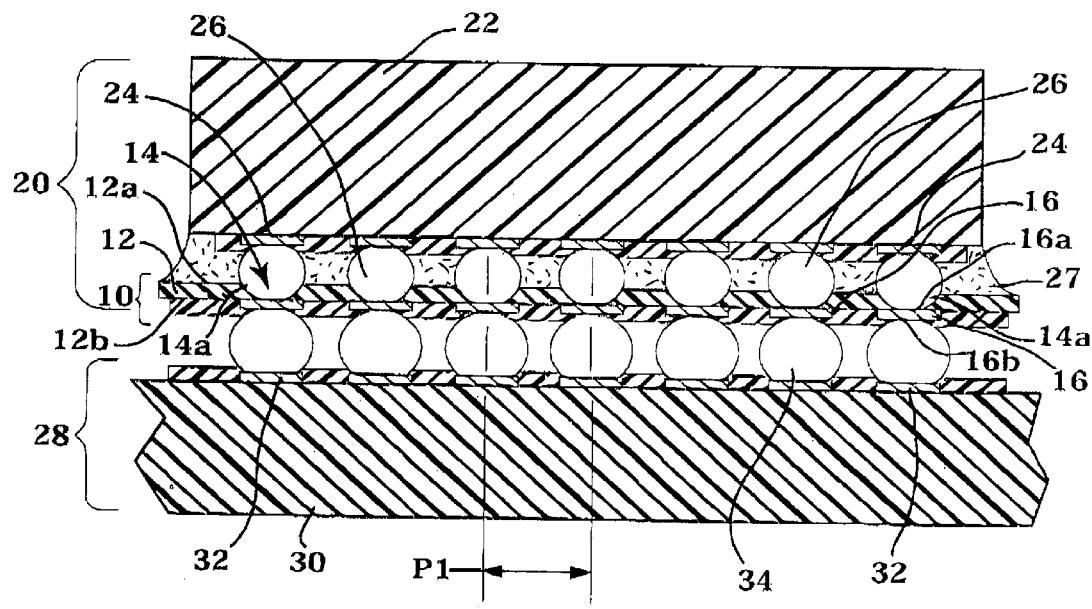
FIG. 1 is a cross sectional view illustrating an embodiment of a flip chip electronic package including an interposer circuit having contact members with aligned first and second interconnect surfaces.
Figure 2:
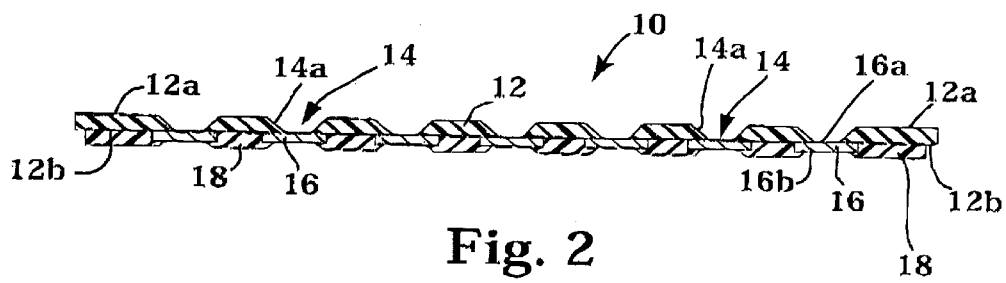
FIG. 2 is a cross sectional view illustrating the interposer circuit of FIG. 1.
Figure 3A:
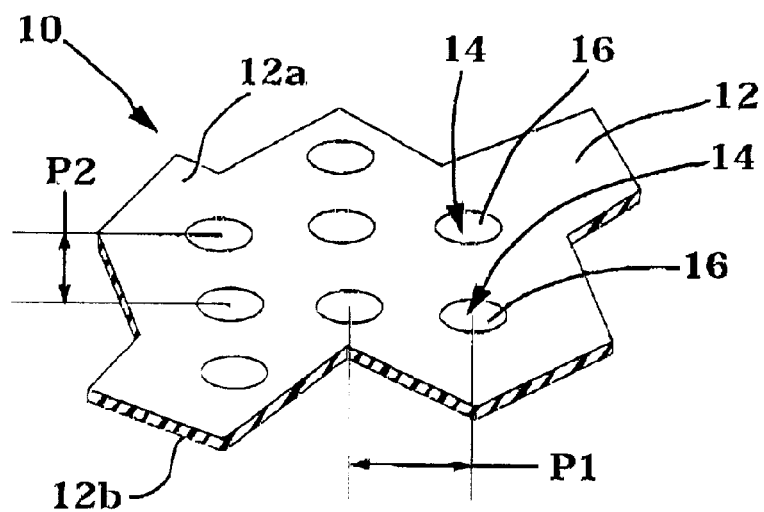
FIG. 3A is a fragmentary perspective view illustrating the interposer circuit of FIG. 2.

An embodiment of an interposer circuit 10 is illustrated in FIGS. 1–3. The interposer circuit 10 includes a dielectric core 12 having a first side 12a and a second side 12b. The dielectric core 12 includes a plurality of passages 14 extending therethrough. Each passage 14 includes a sidewall 14a. The sidewalls 14a may be substantially vertical or tapered relative to the surfaces 12a and 12b of the dielectric core 12. The passages 14 are arranged in an area array, FIG. 3A, having a first direction pitch P1 and a second direction pitch P2. Typically, the first direction pitch P1 and the second direction pitch P2 are the same. In other embodiments (not shown), the first direction pitch P1 is different than the second direction pitch P2, or the area array may have a random configuration.

A plurality of contact members 16 are attached to the second surface 12b of the dielectric core 12. Each one of the contact members 16 is positioned adjacent to a respective one of the passages 14. A solder mask layer 18 is formed on the second side 12b of the dielectric core 12. The solder mask layer 18 is formed over a portion of each conductive member 16.

Several suitable materials for forming the solder mask layer 18 are commercially available. Preferred materials for the dielectric core 12 and the contact members 16 are polyimide and copper, respectively. The interposer circuit 10 can be fabricated using several known techniques.

Each contact member 16 includes a first interconnect surface 16a and a second interconnect surface 16b, FIGS. 1 and 2. The first interconnect surface 16a of each contact member 16 is accessible from adjacent the first side 12a of the dielectric core 12 through the respective passage 14. The second interconnect surface 16b is accessible from adjacent the second side 12b of the dielectric core 12.

The first interconnect surface 16a is substantially aligned with the second interconnect surface 16b.

A flip chip electronic package 20, FIG. 1, includes a flip chip electronic device 22 electrically connected to the interposer circuit 10. The flip chip electronic device 22 includes a plurality of bonding pads 24. The flip chip electronic device 22 is positioned relative to the interposer circuit 10 such that each bonding pad 24 is aligned with a respective one of the contact members 16.

A first conductive element 26 is electrically connected between. each contact member 16 and the respective aligned bonding pad 24. Examples of the first conductive elements 26 include solder bumps, solder balls, conductive particles in anisotropic adhesives and other types of conductive 25 elements that can be attached to the bonding pads of an electronic device under heat and/or pressure for forming an electrical connection.

An underfill material 27 is applied between the flip chip electronic device 22 and the interposer circuit 10. Preferred underfill materials have a coefficient of thermal expansion (CTE) that is similar to the CTE of the conductive elements 26 and to the CTE of a plurality of solder balls 34. Accordingly, stress related failures arising from a CTE mismatch between the printed circuit substrate 28 and the flip chip electronic device 22 are reduced. Underfill materials are well known in the art and are commercially available from several suppliers.

The flip chip electronic package 20 is electrically connected to a printed circuit substrate 28 for routing data signals and power between the flip chip electronic package 20 and related components (not shown) in an electronic apparatus. The printed circuit substrate 28 includes a dielectric substrate 30 having a plurality of solder ball pads 32 attached to a surface thereof. The flip chip electronic package 20 is positioned relative to the printed circuit substrate 28 such that each solder ball pad 32 is substantially aligned with a respective one of the contact members 16. Each solder ball 34 is electrically connected between each solder ball pad 32 and the second interconnect surface 16b of the respective aligned contact member 16.

The dielectric core 12 includes one or more layers of dielectric material. In conventional interposer circuits, an interposer core including a multilayer construction having one or more interior conductive layers is used. By eliminating the interior conductive layers, the interposer circuits disclosed herein can be fabricated more cost effectively and can have a reduced cross sectional thickness.

Figure 3B:
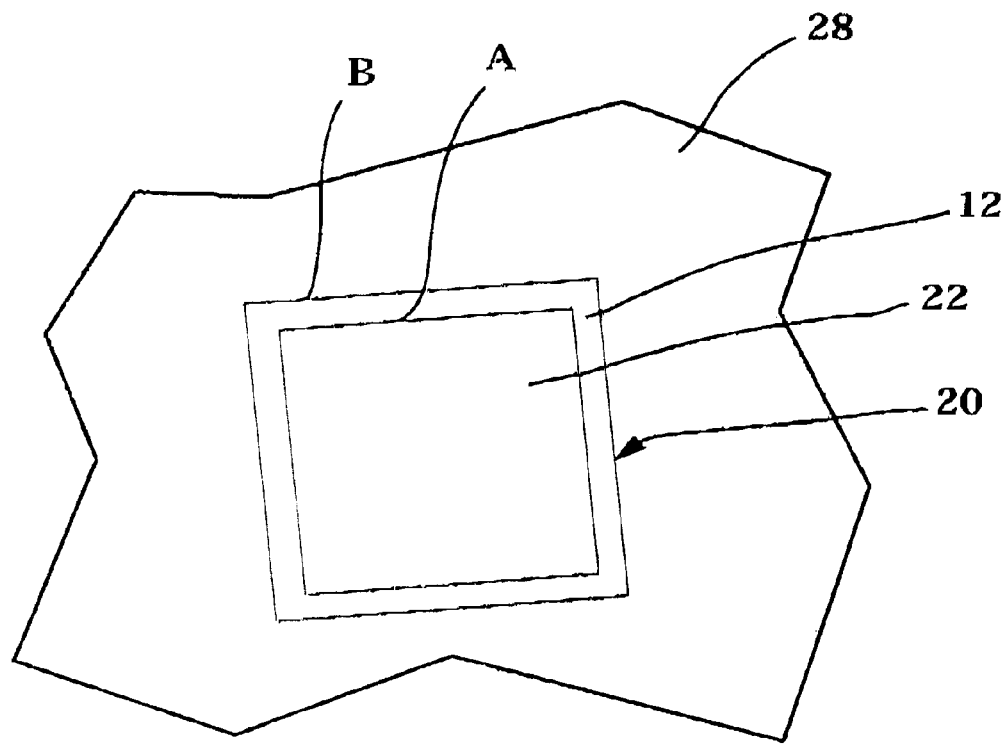
FIG. 3B is a fragmentary plan view of the flip chip electronic package of FIG. 1.

The flip chip electronic package 20, FIG. 3B, has a chip scale package format. The flip chip electronic device 22 defines a first perimeter edge A and the dielectric core 12 defines a second perimeter edge B. The first perimeter edge A defines a first area preferably about the same size as an area defined by the second perimeter edge B.

It is desirable for the flip chip electronic package 20 to have a chip scale package format. The chip scale package format provides for an electronic package having a smaller footprint size. The smaller footprint size occupies less space in a given application, allowing an associated electronic apparatus to be made smaller or to have additional components incorporated therein in the extra space.

Figure 4:
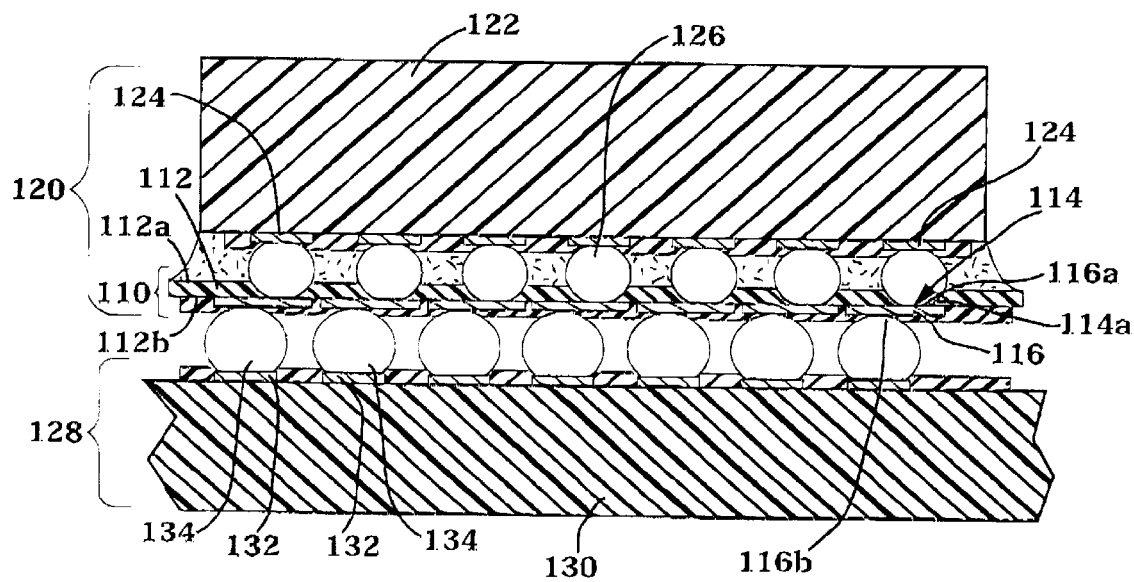
FIG. 4 is a cross sectional view illustrating an embodiment of a flip chip electronic package including an interposer circuit having contact members with offset first and second interconnect surfaces.
Figure 5:
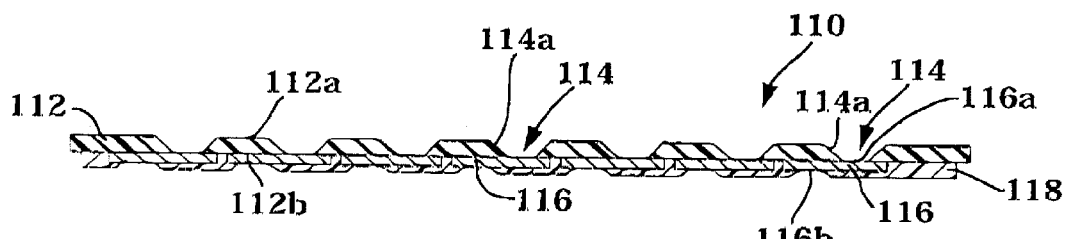
FIG. 5 is a cross sectional view illustrating the interposer circuit of FIG. 4.

An embodiment of an interposer circuit 110 is illustrated in FIGS. 4 and 5. The interposer circuit 110 includes a dielectric core 112 having a first side 112a and a second side 112b. The dielectric core 112 includes a plurality of passages 114 extending therethrough. Each passage 114 includes a sidewall 114a. Each sidewall 114a may be substantially vertical or tapered relative to the surfaces 112a and 112b of the dielectric core 112.

A plurality of contact member 116 are attached to the second surface 112b of the dielectric core 112. Each one of the contact members 116 is positioned adjacent to a respective one of the passages 114. A solder mask layer 118 is formed on the second side 112b of the dielectric core 112. The solder mask layer 118 is formed over a portion of each conductive member 116.

Each contact member 116 includes a first interconnect surface 116a and a second interconnect surface 116b. The first interconnect surface 116a of each contact member is accessible from adjacent to the first side 112a of the dielectric core 112 through the respective passage 114. The second interconnect surface 116b is accessible from the second side 112b of the dielectric core 112. The first interconnect surface 116a is offset from the second interconnect surface 116b.

A flip chip electronic package 120, FIG. 4, includes a flip chip electronic device 122 electrically connected to the interposer circuit 110. The flip chip electronic device 122 includes a plurality of bonding pads 124. The flip chip electronic device 122 is positioned relative to the interposer circuit 110 such that each bonding pad 124 is aligned with the first interconnect surface 116a of a respective one of the contact members 116.

A first conductive element 126 is electrically connected between each contact member 116 and the respective aligned bonding pad 124. Examples of the first conductive elements 126 include solder bumps, solder balls, conductive particles in anisotropic adhesives and other types of conductive elements that can be attached to the bonding pads of an electronic device under heat and/or pressure for forming an electrical connection.

The flip chip electronic package 120 is electrically connected to a printed circuit substrate 128 for routing data signals and power between the flip chip electronic package 120 and related components (not shown) in an electronic apparatus. The printed circuit substrate 128 includes a dielectric substrate 130 having a plurality of solder ball pads 132 attached to a surface thereof. The flip chip electronic package 120 is positioned relative to the printed circuit substrate 128 such that each solder ball pad 132 is substantially aligned with the second interconnect surface 116b of a respective contact member 116. A solder ball 134 is electrically connected between each solder ball pad 132 and the second interconnect surface 116b of the respective contact member 116.

Figure 6:
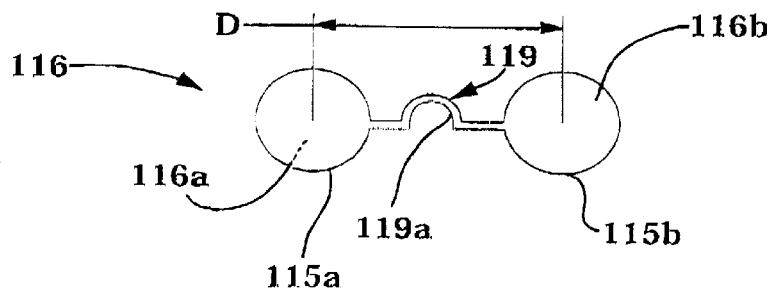
FIG. 6 is a plan view illustrating an embodiment of a contact member including a stress relief portion.

The contact member 116, FIG. 6, includes a first portion 115a that defines the first interconnect surface 116a and a second portion 115b that defines the second interconnect surface 116b. Bonding pads illustrate one example of the first and second portions 115a, 115b. A trace 119 is attached between the first and the second portions 115a, 115b of the contact member 116. The trace 119 includes a stress relief portion 119a. The stress relief portion 119a permits relative movement between the first and the second portions 115a, 115b with a reduced potential for fracture of the trace 119. The stress relief portion 119a is substantially "U" shaped. It will be appreciated by one skilled in the art that the stress relief portion 119a may have another shape, such as an "S" shape, for example.

Figure 7:
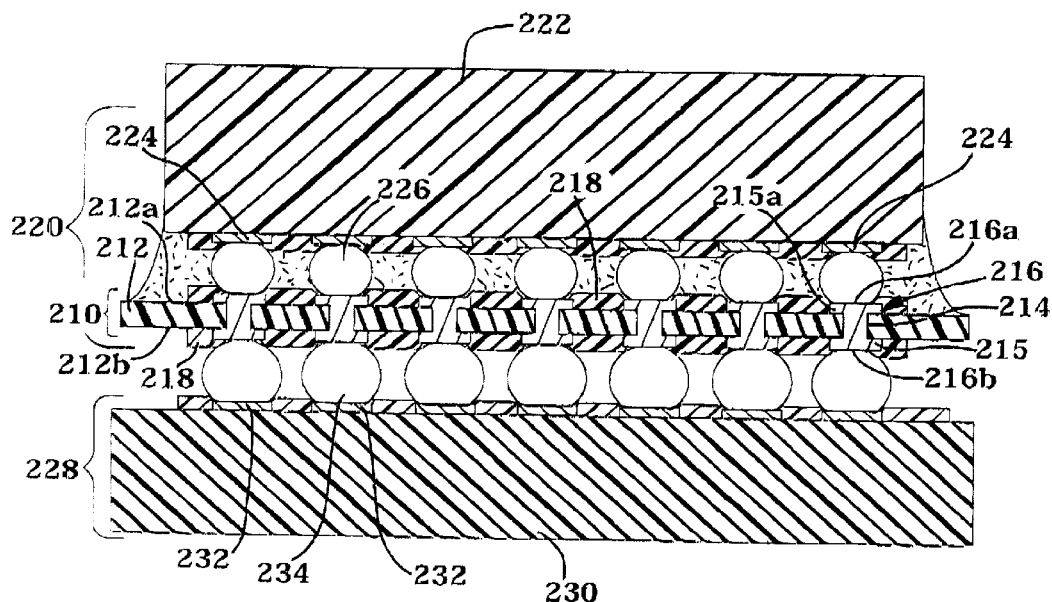
FIG. 7 is a cross sectional view illustrating an embodiment of a flip chip electronic package including an interposer circuit having a dielectric core with conductive plugs extending therethrough.
Figure 8:
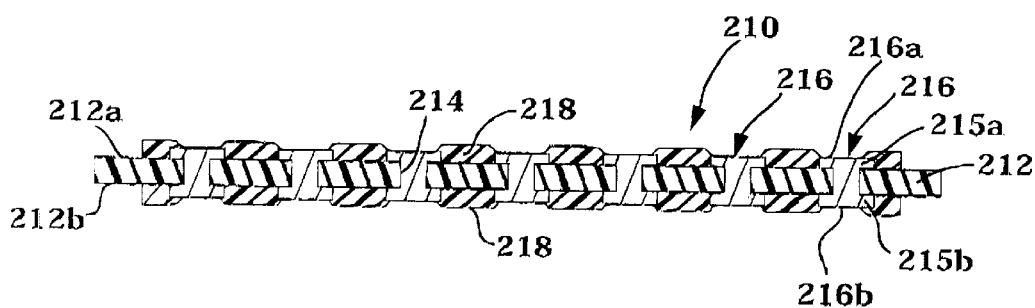
FIG. 8 is a cross sectional view illustrating the interposer circuit of FIG. 7.

An embodiment of an interposer circuit 210 is illustrated in FIGS. 7 and 8. The interposer circuit 210 includes a dielectric core 212 having a first side 212a and a second side 212b. The dielectric core 212 includes a plurality of passages 214 extending therethrough. Each passage 214 has a contact member 216, such as a conductive plug, attached therein.

A first end 215a of each contact member 216 defines a respective first interconnect surface 216a and a second end 215b of each contact member 216 defines a respective second interconnect surface 216b. A solder mask layer 218 is formed on the first side 212a and the second side 212b of the dielectric core 212. The solder mask layer 218 is formed over a portion of each interconnect surface 216a, 216b.

A flip chip electronic package 220, FIG. 7, includes a flip chip electronic device 222 electrically connected to the interposer circuit 210. The flip chip electronic device 222 includes a plurality of bonding pads 224. The flip chip electronic device 222 is positioned relative to the interposer circuit 210 such that each bonding pad 224 is aligned with a respective one of the contact members 216.

A first conductive element 226 is electrically connected between each contact member 216 and the respective aligned bonding pad 224. Examples of the first conductive elements 226 include solder bumps, solder balls, conductive particles in anisotropic adhesives and other types of conductive elements that can be attached to the bonding pads of an electronic device under heat and/or pressure for forming an electrical connection.

The flip chip electronic package 220 is electrically connected to a printed circuit substrate 228 for routing data signals and power between the flip chip electronic package 220 and related components (not shown) in an electronic apparatus. The printed circuit substrate 228 includes a dielectric substrate 230 having a plurality of solder ball pads 232 attached to a surface thereof. The flip chip electronic package 220 is positioned relative to the printed circuit substrate 228 such that each solder ball pad 232 is substantially aligned with the second interconnect surface 216b of a respective contact member 216. A solder ball 234 is electrically connected between each solder ball pad 232 and the second interconnect surface 216b of the respective contact member 216.

Figure 9:
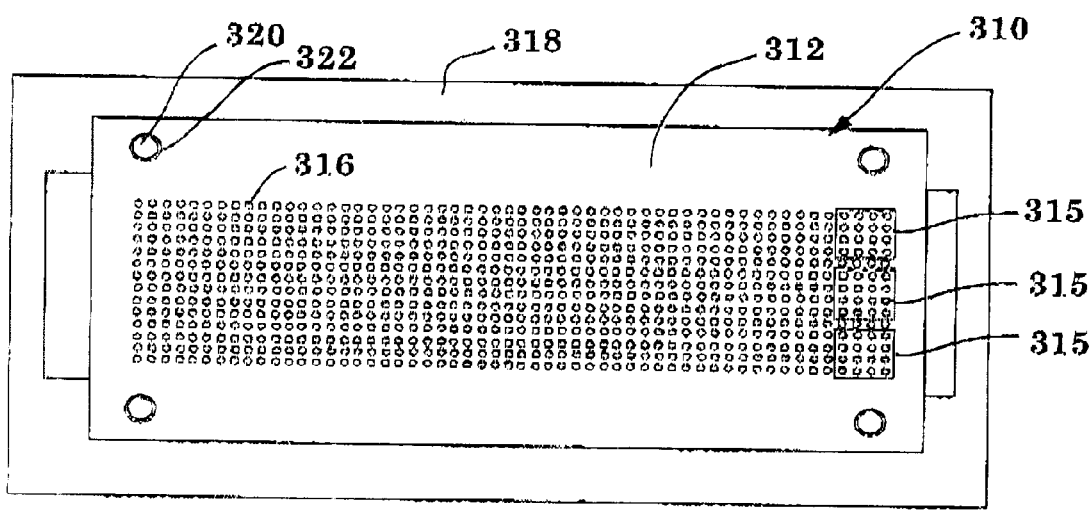
FIG. 9 is a plan view illustrating an embodiment of a rigidizing frame having an interposer circuit substrate attached thereto.

Referring to FIG. 9, an interposer circuit substrate 310 includes an array of contact members 316 attached to a dielectric core 312. The array of contact members 316 defines an area substantially greater than a mounting area of a flip chip electronic package. Several device mounting regions 315 can be defined in the array of contact members 316. In this manner, several flip chip electronic packages can be attached to the interposer circuit substrate 310, substantially reducing the assembled cost of each flip chip electronic package. Following attachment of the flip chip electronic devices, individual flip chip electronic packages are excised from the interposer circuit substrate 310.

It is preferred for the dielectric core 312 to be made of a flexible polymeric material such as a polyimide film. To provide for additional rigidity during attachment of the flip chip electronic devices, the interposer circuit substrate 310 is attached to a rigidizing frame 318. The rigidizing frame 318 includes a plurality of mounting pins 320 and the interposer circuit substrate 310 includes a plurality of apertures 322 extending through the dielectric core 312. Accordingly, the interposer circuit substrate 310 can be attached to the rigidizing frame 318 with each aperture 322 mounted on a corresponding one of the pins 320.

Figure 10:
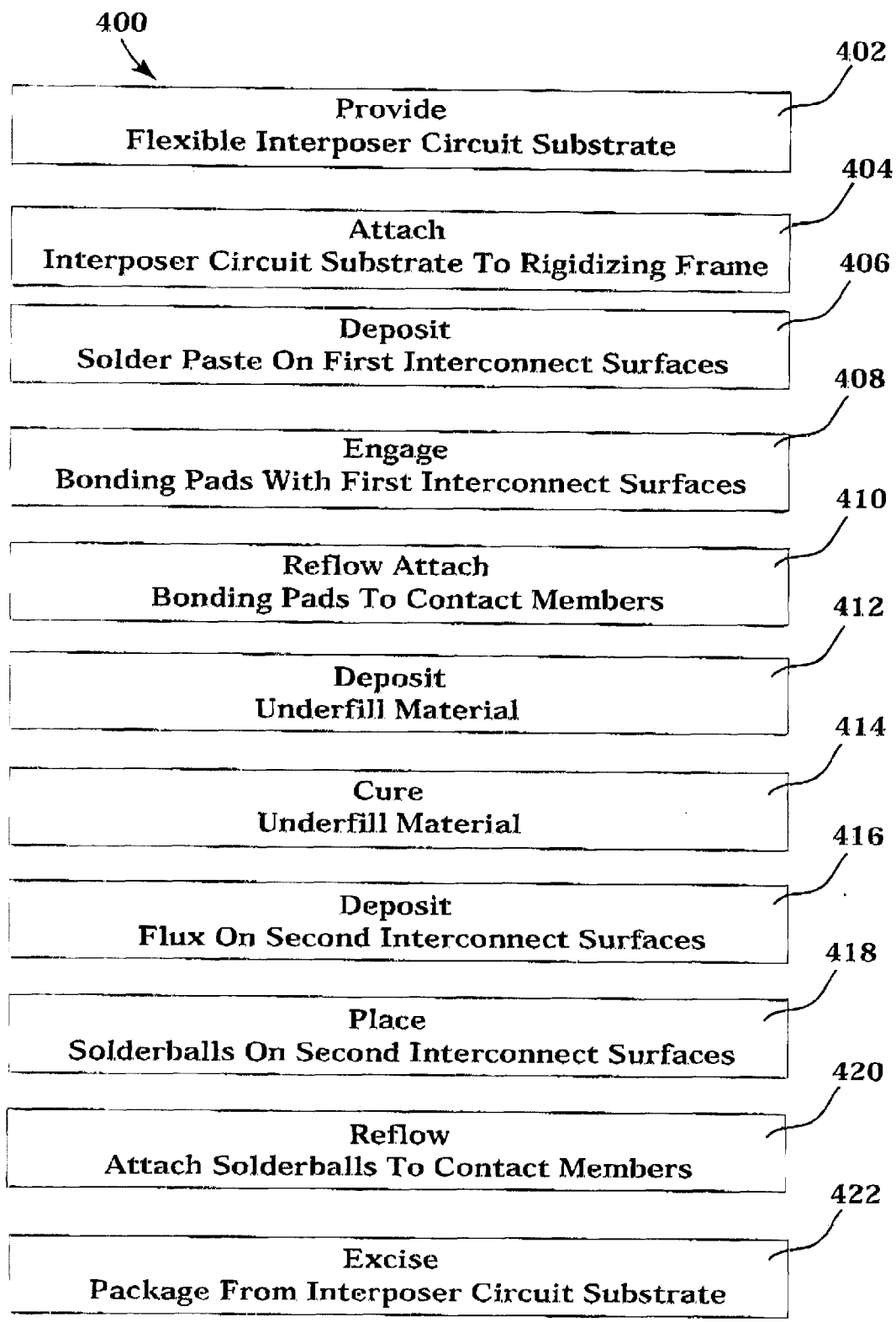
FIG. 10 is a flow diagram view illustrating an embodiment of a process for fabricating a flip chip electronic package according to the present invention.

FIG. 10 illustrates an embodiment of a process 400 for fabricating a flip chip electronic package according to the present invention. At 402, a flexible interposer substrate, including a plurality of contact members attached to a dielectric core, is provided. The contact members are positioned at a given pitch such that the interposer circuit serves as a universal packaging substrate for any electronic device having bonding pads at the same pitch. Such a universal packaging substrate and method of manufacturing flip chip electronic packages significantly reduces costs associated with custom tooling.

At 404, the interposer circuit substrate is attached to a rigidizing frame and solder paste is deposited at 406, on a first interconnect surface of each contact member. At 408, one or more flip chip electronic devices including a plurality of bonding pads and a conductive element attached to each bonding pad are positioned on the interposer circuit substrate with the conductive elements engaged with corresponding ones of the first interconnect surfaces. At 410, a solder reflow operation is performed to attach each conductive element to the corresponding first interconnect surface.

An uncured underfill material is deposited at 412, between the interposer circuit substrate and each flip chip electronic device. The underfill material is then cured at 414 using heat, ultra-violet light, etc. Flux is deposited at 416 on a second interconnect surface of each contact member. At 418, a solder ball is placed on the second interconnect surface of each contact member and then reflow attached at 420, to the respective second interconnect member. The flip chip electronic devices are then excised at 422 from the interposer circuit substrate to produce individual flip chip electronic packages.

Flip chip electronic packages enable a small form factor because all of the bonding pads are situated beneath the die. In this configuration, extra space is not required for wires or traces to fan out from the periphery of the IC. There are a number of ways in which the cost associated with flip chip electronic packages can be reduced. A key aspect of reducing the cost is that flip chip dies have a reduced area relative to dies for other types of electronic packages. With wire bonding, the finest pitch that is possible on the chip is approximately 60–70 microns. As circuit width on the chip decreases from 0.35 to 0.25 and then further to an anticipated 0.18 microns, flip chip dies and packages will be necessitated such that the edge lengths of the die can be sufficiently reduced. Accordingly, the cost associated with the size of the die will also be reduced.

Currently, available reductions in size are often not implemented. Some manufacturers prefer to leave the bonding pads around the perimeter edge of the die. By doing so, one chip can be used for both large scale wire bond and large scale flip chip package formats. The ability to position these pads over the full area of the chip in the form of solder bumps, enables a higher number of pads per unit area such that the chip size can be reduced.

Eliminating the need for expensive gold wires and the relatively slow process for stitching them onto the package further reduces cost of flip chip electronic packages relative to wire bond packages. Flip chip electronic packages also provide improved electrical performance over that of wire bond packages. The thin wires of wire bond packages tend to increase the self-inductance of the circuit path to power and ground planes therein, thus resulting in simultaneous switching noise. Flip chip electronic packages provide superior performance because conductive elements situated under the power and ground locations on the chip distribute current at very low inductance values. Accordingly, flip chip electronic packages are able to operate at higher frequencies with significantly less inductance-induced noise.

Accordingly, it is appropriate that the appended claims be construed broadly and in a manner consistent with the scope of the embodiments and descriptions disclosed herein.

What is claimed is:

1. A chip-scale electronic package including a dielectric core having an array of contact members attached thereto, each contact member including a first interconnect surface accessible from a first side of the dielectric core and a second interconnect surface accessible from a second side of the dielectric core; and a flip chip electronic device including an array of bonding pads on a mounting surface thereof and having a conductive element attached to each one of the bonding pads, each conductive element substantially aligned with and electrically connected to a respective one of the first interconnect surfaces, wherein each contact member includes two spaced apart bonding pads attached to the second side of the dielectric core and having a conductive trace electrically connected therebetween, a first one of the bonding pads defining the first interconnect surface and a second one of the bonding pads defining the second interconnect surface.

2. The electronic package of claim 1 wherein the trace includes a stress relief portion.

3. The electronic package of claim 2 wherein the stress relief portion is substantially U-shaped.

4. A printed circuit assembly, comprising:

an interposer circuit including a flexible dielectric core having an array of contact members attached thereto, each contact member including a first interconnect surface accessible from a first side of the dielectric core and a second interconnect surface accessible from a second side of the dielectric core;

a conductive element attached to the first interconnect surface of each contact member;

a flip chip semiconductor die including an array of bonding pads on a mounting surface thereof, each bonding pad of the semiconductor die substantially aligned with a respective one of the first interconnect surfaces and electrically connected to the corresponding conductive element, the electronic device defining a perimeter edge thereof, the perimeter edge circumscribing the array of contact members;

a solder ball attached to the second interconnect surface of each contact member; and a printed circuit substrate including an array of solder ball pads on a surface thereof, each one of the solder ball pads substantially aligned with a respective one of the second interconnect surfaces and electrically connected to the corresponding solder ball, wherein each contact member includes two spaced apart bonding pads having a conductive trace electrically connected therebetween, a first one of the bonding pads defining the first interconnect surface and a second one of the bonding pads defining the second interconnect surface.

5. The printed circuit assembly of claim 4 wherein the trace includes a stress relief portion.

6. The printed circuit assembly of claim 5 wherein the stress relief portion is substantially U-shaped.

* * * * *